United States Patent
Sekiguchi et al.

(10) Patent No.: US 6,304,001 B1
(45) Date of Patent: Oct. 16, 2001

(54) SEMICONDUCTOR DEVICE WITH ALIGNMENT MARK AND MANUFACTURING METHOD THEREOF

(75) Inventors: Noboru Sekiguchi; Kimio Hagi; Mitsuo Kimoto, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/280,649

(22) Filed: Mar. 29, 1999

(30) Foreign Application Priority Data

Jul. 7, 1998 (JP) .................................................. 10-191828

(51) Int. Cl.$^7$ ......................... H01L 23/544; H01L 21/76
(52) U.S. Cl. ......................... 257/797; 257/734; 438/401; 438/640; 438/975
(58) Field of Search .................................... 438/401, 618, 438/637, 638, 639, 640, 975; 257/734, 774, 797

(56) References Cited

U.S. PATENT DOCUMENTS

| | | | |
|---|---|---|---|
| 5,100,834 | * 3/1992 | Mukai | 438/662 |
| 5,475,268 | * 12/1995 | Kawagoe et al. | 257/797 |
| 5,872,042 | * 2/1999 | Hsu et al. | 438/401 |
| 5,933,744 | * 8/1999 | Chen et al. | 438/401 |
| 5,958,800 | * 9/1999 | Yu et al. | 438/720 |
| 6,020,249 | * 2/2000 | Shih et al. | 438/401 |
| 6,100,158 | * 8/2000 | Lee et al. | 438/401 |

FOREIGN PATENT DOCUMENTS 56-140626 * 11/1981 (JP) .............................. H01L/21/30

* cited by examiner

Primary Examiner—T. N. Quach
(74) Attorney, Agent, or Firm—McDermott, Will & Emery

(57) ABSTRACT

The semiconductor device with the alignment mark includes a convex portion as a film growth control region for forming side surfaces approximately parallel to sidewalls on surfaces opposite to the sidewalls of first metal interconnection layer formed in a recess portion of the alignment mark at the time of deposition of first metal interconnection layer. Thus, the semiconductor device with the alignment mark and manufacturing method thereof allowing the easy and accurate detection of the location of a layer deposited on side surfaces of the alignment mark can be provided.

10 Claims, 14 Drawing Sheets

SEMICONDUCTOR DEVICE WITH ALIGNMENT MARK AND MANUFACTURING METHOD THEREOF

BACKGROUND OF THE INVENTION

1 Field of the Invention

The present invention relates to a semiconductor device with an alignment mark and a manufacturing method thereof, and particularly to a semiconductor device with an alignment mark and a manufacturing method thereof facilitating alignment mark detection and improving alignment accuracy.

2 Description of the Background Art

FIG. 21 is a section of a semiconductor device having a multilayer interconnection structure. In this semiconductor device, a gate interconnection 3 is formed on a semiconductor substrate 1 with an insulation film posed therebetween. Gate interconnection 3 is placed between source/drain regions 4 formed in semiconductor substrate 1.

A first metal interconnection layer 6, of aluminum or the like, is formed on gate interconnection 3 with an interlayer insulation film 5 posed therebetween. First metal interconnection layer 6 is electrically connected with source/drain region 4 via a contact hole 5a.

A second metal interconnection layer 8, of aluminum or the like, is formed on first metal interconnection layer 6 with an interlayer insulation film 7 posed therebetween. Second metal interconnection layer 8 is electrically connected with first metal interconnection layer 6 via a contact hole 7a, and covered with a protective film 11.

In this structure, precise interconnections between first metal interconnection layer 6 and gate interconnection 3 and second metal interconnection layer 8 and first metal interconnection layer 6 are necessary. Therefore, the precise formation of a resist film, which is used for the patterning of first metal interconnection layer 6 and second metal interconnection layer 8, is required.

Conventionally an alignment mark is used for the positioning of the resist film for the patterning of first metal interconnection layer 6 and second interconnection layer 8. As an example, an alignment mark formed in interlayer insulation film 5 for the positioning of the resist film used for the patterning of first metal interconnection layer 6 will be described referring to FIGS. 22 and 23.

With reference to FIGS. 22 and 23, an alignment mark 4 formed in interlayer insulation film 5 is formed as a recess portion being rectangular in plan and having two sets of opposing sidewalls 4a, 4b and 4c, 4d. In recent years, for the improvement of a coverage, first metal interconnection layer 6 has been deposited on alignment mark 4 by an interconnection process using a high temperature aluminum sputtering technique.

The high temperature sputtering technique is different from a normal sputtering technique in that a heat treatment at 300° C.–600° C. is performed during or after the deposition of a film.

As a result, an aluminum grain 6A grows large as shown in FIGS. 22 and 23 and an aluminum material flows in the recess portion, whereby a gentle-sloped side surface is formed in a region enclosed and designated by A in FIG. 23.

At the detection of a resist film side alignment mark used for the patterning of first metal interconnection layer 6, signals P1 and P3 corresponding to side surfaces 9a and 9b of resist film side alignment mark 9 can easily be located because of high strength and distinct peaks of these signals as can be seen from FIG. 24 showing detection signal strength measured at a section taken along a line X1–X1' of FIG. 22.

On the other hand, signals P2 and P4 corresponding to side surfaces 6a and 6b of first metal interconnection layer 6, which are deposited on sidewalls 4a and 4b of alignment mark 4 in the insulation layer, cannot be located accurately because of their low strength and indistinct peaks. Therefore, accurate measurements of a distance L1 between signal P1 and signal P2 and a distance L2 between signal P3 and signal P4 cannot be obtained.

FIG. 25 shows detection signal strength measured at a section taken along a line X2–X2' of FIG. 22 and FIG. 26 shows detection signal strength measured at a section taken along a line X3–X3' of FIG. 22. As can be seen from the comparison of these drawings, a largely grown aluminum grain 6A causes the fluctuation of the detected locations of signals P2 and P4 corresponding to side surfaces 6a and 6b of first metal interconnection layer 6 deposited on sidewalls 4a and 4b of alignment mark 4, depending on the measurement points.

Above described problems hinder the easy and accurate detection of the locations of signals P2 and P4 corresponding to side surfaces 6a and 6b of first metal interconnection layer 6 deposited on sidewalls 4a and 4b of alignment mark 4.

SUMMARY OF THE INVENTION

An object of the present invention is to provide a semiconductor device with an alignment mark and a method of manufacturing the same allowing the easy and accurate detection of the location of an interconnection layer deposited on a sidewall of the alignment mark.

In the semiconductor device with the alignment mark in accordance with the present invention, the alignment mark, which is formed on an insulation layer in order to detect the location of interconnection layer formed on the insulation layer, is a recess portion being approximately rectangular in plan and having two sets of opposing sidewalls, wherein the recess portion includes a film growth control region for forming on a surface opposite to the sidewalls, a side surface of the interconnection layer, which is formed in the recess portion, approximately parallel with the sidewalls at the deposition of the interconnection layer.

In one specific aspect of the semiconductor device with the alignment mark, the film growth control region includes a convex portion arranged in the recess portion such that it opposes to the sidewall.

With the alignment mark having the film growth control region with above mentioned structure, when the interconnection layer is formed by the high temperature sputtering on the insulation layer having the alignment mark, a surface of the sidewall opposite to the convex portion and a surface of the convex portion opposite to the sidewall each serve as a block with respect to an angle of incidence of grains sputtered for forming the interconnection layer.

Thus, as a few grains sputtered for the formation of the interconnection layer enter and are deposited on the surface of sidewall opposite to the convex portion and the surface of convex portion opposite to the sidewall, the deposition of interconnection layer on these portions are small.

As a result, the grain growth of interconnection layer and the flow of interconnection layer material in this area are suppressed. Thus a side surface of the interconnection layer approximately parallel with the sidewall is formed both on the surface of the sidewall opposite to the convex portion and on the surface of the convex portion opposite to the sidewall. The formation of these two side surfaces of interconnection layer allows easy and accurate detection of the location of interconnection layer deposited on the alignment mark.

In the semiconductor device with the alignment mark, preferably, the convex portion has a sharp ridge portion at its upper end and the sidewall has a taper parting from the convex portion as it goes upward at an upper end region facing the convex portion.

By this structure, the grain growth of interconnection layer and the flow of interconnection layer material are suppressed also at the upper end of the convex portion. Therefore, the easy and accurate detection of the location of interconnection layer deposited on the alignment mark is allowed by the upper end portion of the convex portion.

In another specific aspect of the semiconductor device with the alignment mark, the insulation layer is formed on two lower interconnection layers arranged parallel to each other in a direction not parallel with a direction of interconnection layer's extension, the recess portion is formed in the insulation layer placed between two lower interconnection layers, the insulation layer includes three layers, that is lower, middle and upper layers, and the film growth control region is formed with an exposed surface formed in the recess portion and protruding inside the recess portion further at the upper layer than at the middle layer and a taper formed in the upper end region of the upper layer of the exposed surface and parting from the recess portion as it goes upwards.

With the alignment mark having the film growth control region with above described structure, when the interconnection layer is deposited by the high temperature sputtering on the insulation layer having the alignment mark, the exposed surface, protruding inside the recess portion further at the upper layer than at the middle layer, serves as a block with respect to an angle of incidence of grains sputtered for forming the interconnection layer. Thus, a few grains sputtered for forming interconnection layer enter and are deposited on the middle layer exposed inside the recess portion, whereby the deposition of interconnection layer in this area is small.

As a result, the grain growth of interconnection layer and the flow of interconnection layer material are suppressed at the middle layer exposed inside the recess portion. Thus, a side surface of the interconnection layer is formed which is approximately perpendicular with the exposed portion of the upper layer exposed inside the recess portion. By the formation of side surface of the interconnection layer, easy and accurate detection of the location of interconnection layer deposited on the alignment mark is allowed.

In one aspect of the method of manufacturing the semiconductor device with the alignment mark in accordance with the present invention, first the insulation layer is formed. Then on the insulation layer is formed a resist film having an opening pattern, which is rectangular in plan, and a convex pattern, which is formed a prescribed distance away from and opposite to an inner peripheral wall of the opening pattern.

Next, the patterning of the insulation layer is performed by an etching using the resist film as a mask, whereby the recess portion and the convex portion which is arranged in the recess portion opposite to the side walls are formed.

In the method of manufacturing the semiconductor device with the alignment mark, for the detection of the location of interconnection layer formed on the insulation layer, an alignment mark can be manufactured on a surface of the insulation layer. The alignment mark is rectangular in plan, and includes a recess portion having two sets of opposing sidewalls and a convex portion arranged opposite to the sidewall in the recess portion.

In the method of manufacturing the semiconductor device with the alignment mark, preferably, the step for forming the recess portion and the convex portion includes the steps of: performing a first patterning of the insulation layer by the wet etching technique using the resist film as a mask; and performing a second patterning of the insulation layer by a dry etching technique using the resist film as a mask after the first patterning of the insulation layer.

In accordance with the method of manufacturing the semiconductor device with the alignment mark, the upper end of the convex portion is sharp and the sidewall has at its upper end region facing the convex portion, a taper parting from the recess portion as it goes upward.

In another aspect of the method of manufacturing the semiconductor device with the alignment mark in accordance with the present invention, first the insulation layer is formed. Then two lower interconnection layers arranged parallel to each other are formed.

Next the insulation layer is formed on two lower interconnection layers. Then a resist film having an opening portion in a region corresponding to a recess portion is formed in order to form the recess portion in the insulation layer placed between two lower interconnection layers arranged parallel to each other. Then using the resist film as a mask the patterning of the insulation layer is performed by etching technique.

In addition, the step for forming the insulation layer includes a step of forming a three layered structure including lower, middle and upper layers.

In accordance with the method of manufacturing the semiconductor device with the alignment mark, for the detection of the locations of two lower interconnection layers arranged parallel to each other and for the detection of the location of the interconnection layer formed on and in a direction not parallel to two lower interconnection layers, an alignment mark formed as a recess portion, which is approximately rectangular in plan, can be manufactured in the insulation layer placed between the lower interconnection layers and the interconnection layer.

In the method of manufacturing the semiconductor device with the alignment mark, preferably, the step of performing the patterning of the insulation layer includes a step of performing a patterning of the insulation layer by a combination of a wet etching and a dry etching using the resist film as a mask.

In accordance with the method of manufacturing the semiconductor device with the alignment mark, an exposed surface protruding inside the recess portion further at the lower and upper layers than at the middle layer can be formed in the recess portion and a taper parting away from the recess portion as it goes upward can be formed in the upper end region of the upper layer of the exposed surface.

Specifically for the manufacture of the above described structure, a material with a relatively slower etching rate for the same etchant or a material with relatively lower heat contraction for heat treatment is used for the upper and lower layers than for the middle layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 21:
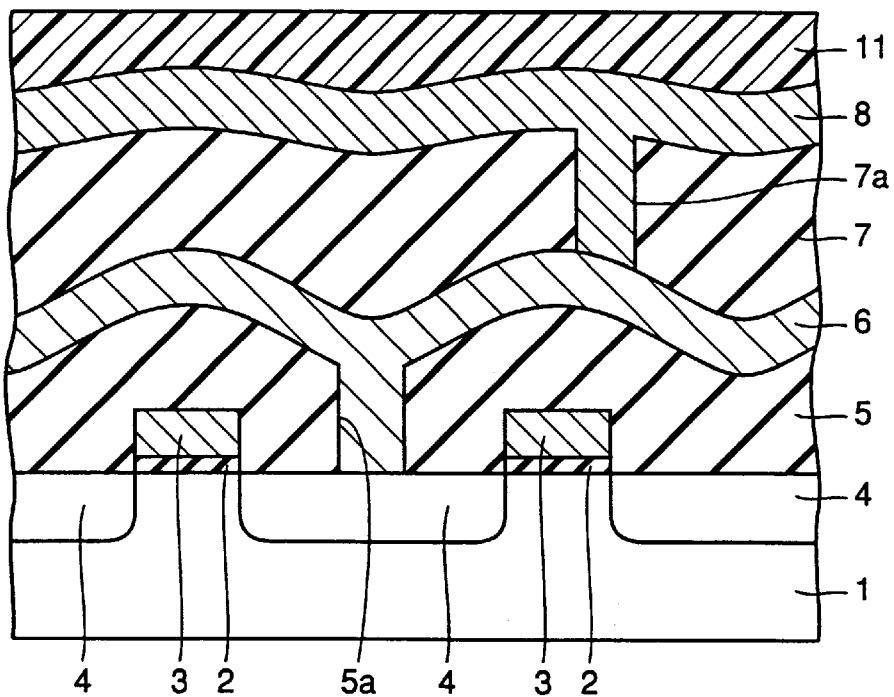
FIG. 21 is a section showing the multilayer interconnection structure of the semiconductor device.

Hereinafter, referring to the drawings, preferred embodiments of the semiconductor device with the alignment mark and the manufacturing method thereof in accordance with the present invention will be described. The alignment marks in accordance with the embodiments described below are applied to semiconductor devices having the structure shown in FIG. 21.

First Embodiment

Figure 1:
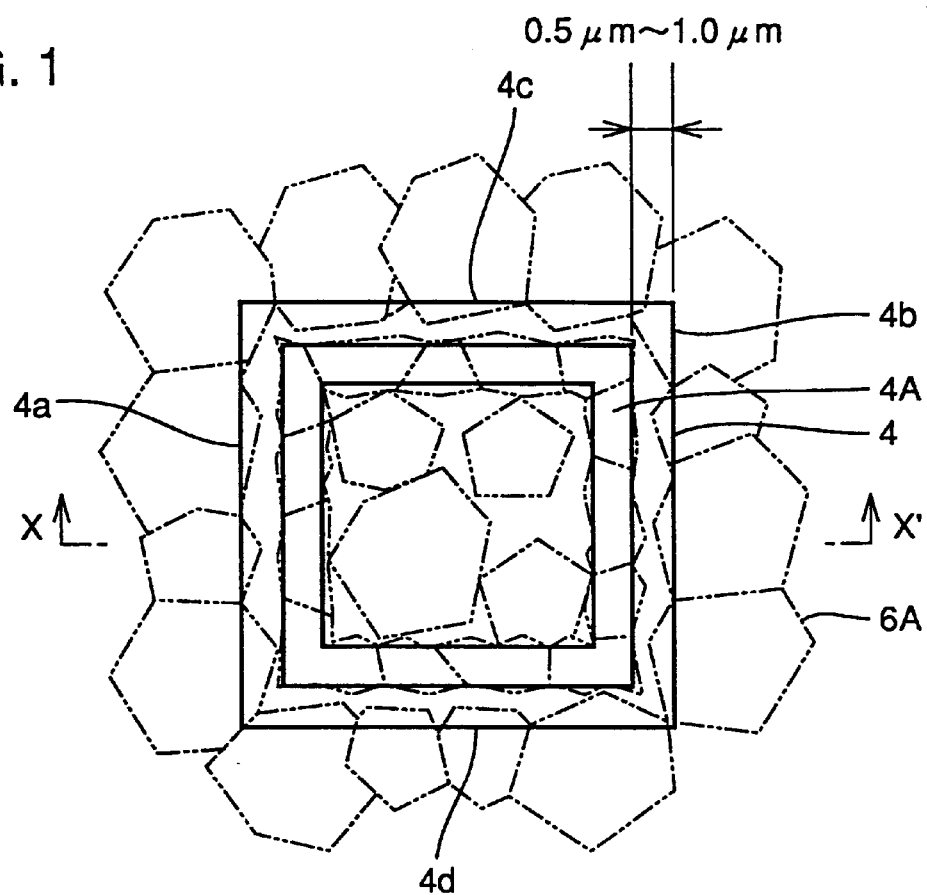
FIG. 1 is a plan view of alignment mark 4 formed in interlayer insulation film 5 in accordance with a first embodiment.
Figure 2:
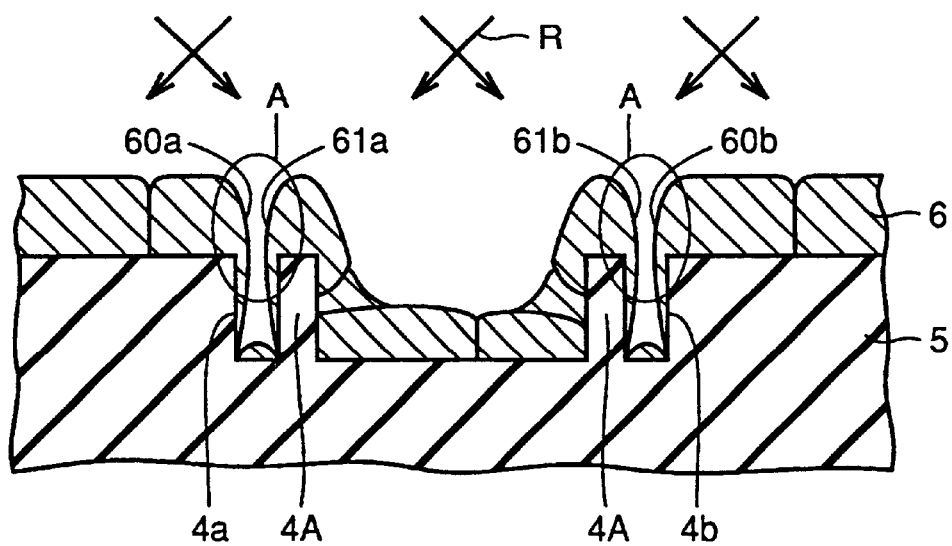
FIG. 2 is a section taken along a line X–X' of FIG. 1.
Figure 22:
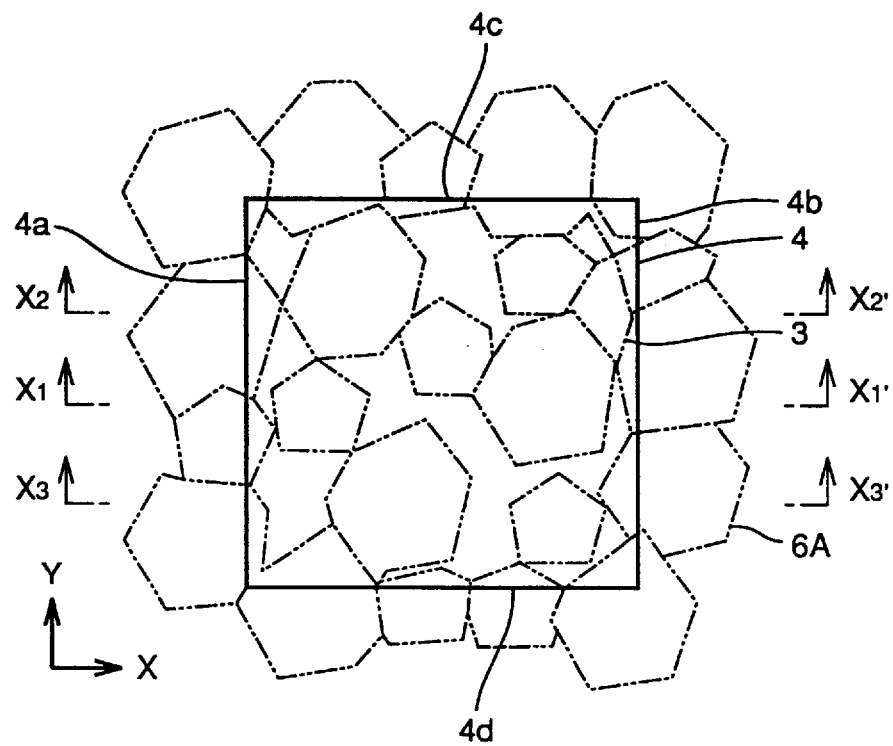
FIG. 22 is a plan view of alignment mark 4 formed in interlayer insulation film 5 in accordance with the conventional art.
Figure 23:
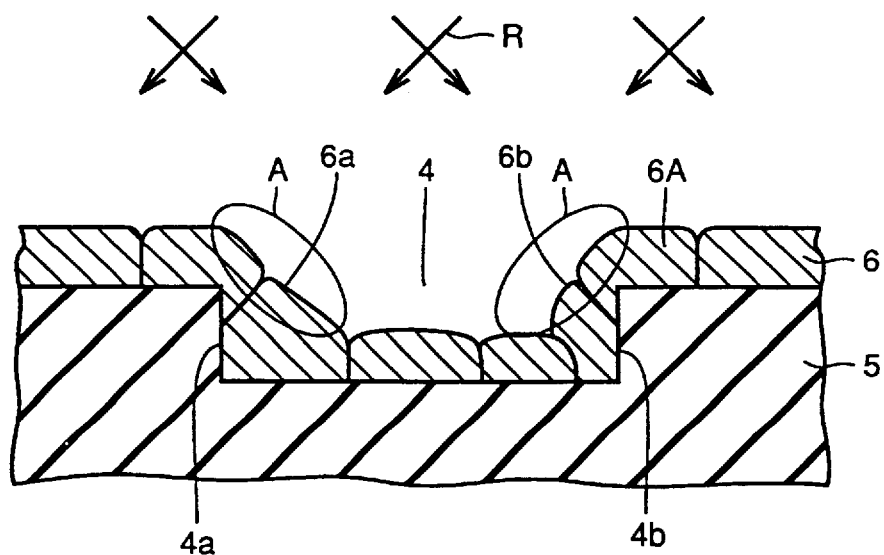
FIG. 23 is a section taken along the line X1–X1' of FIG. 22.
Figure 24:
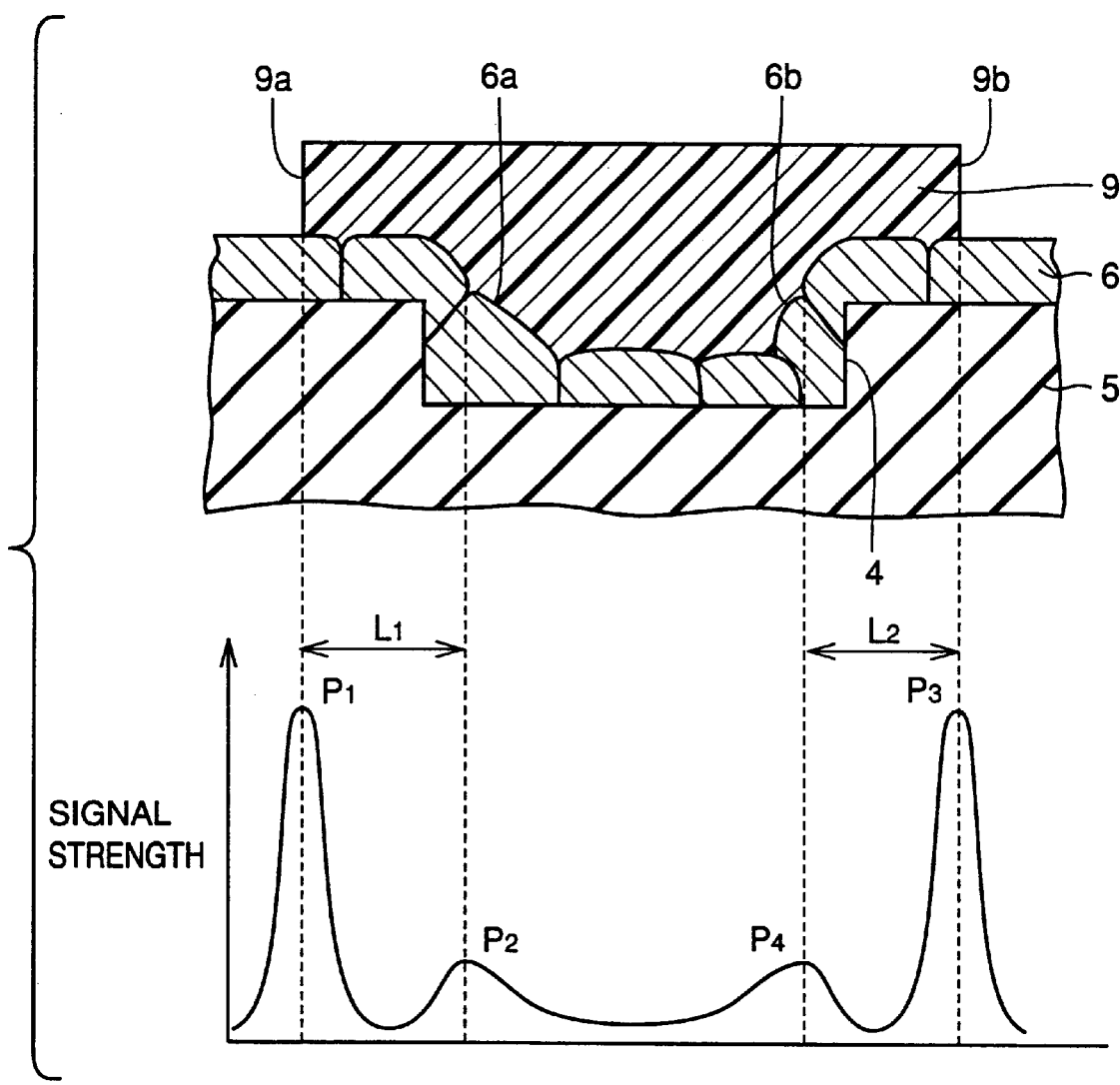
FIG. 24 is an illustration showing the detection signal strength measured at the section taken along the line X1–X1' of FIG. 22.
Figure 25:
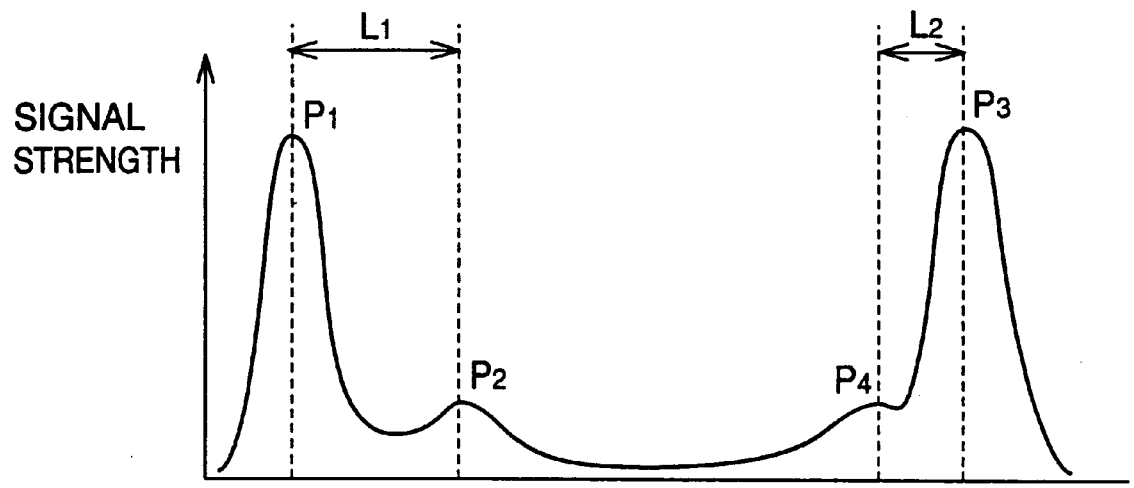
FIG. 25 is a graph showing the detection signal strength measured at the section taken along the line X2–X2' of FIG. 22.
Figure 26:
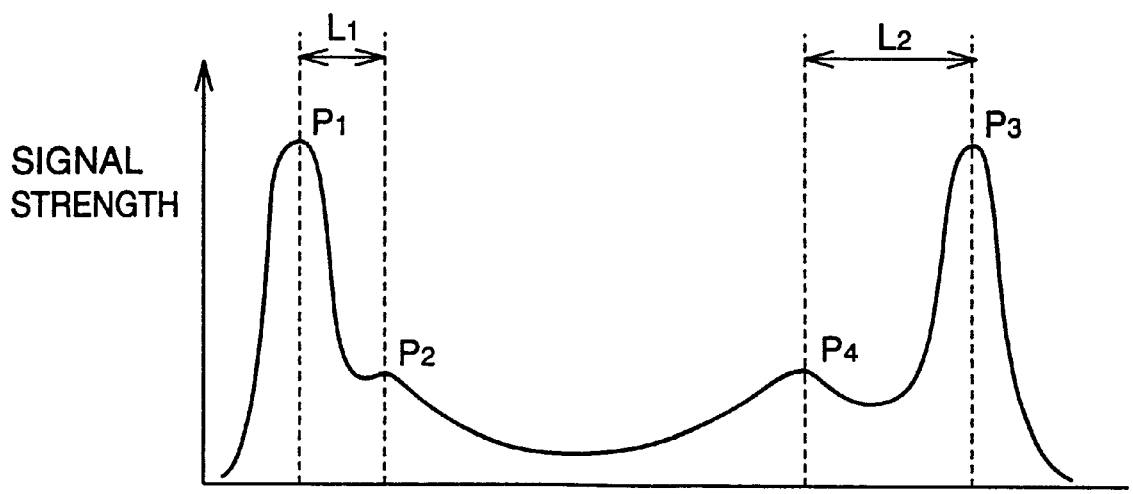
FIG. 26 is a graph showing the detection signal strength measured at the section taken along the line X3–X3' of FIG. 22.

With reference to FIGS. 1 and 2, the structure of alignment mark 4 in accordance with the first embodiment will be described. As alignment mark 4 is formed at the same location with that according to the conventional art described with respect to FIGS. 22 and 23, the same element is designated by the same character and the detailed description thereof will not be repeated. FIG. 1 is a plan view of alignment mark 4 formed in interlayer insulation film 5. First metal interconnection layer 6 is designated by a two-dot chain line for convenience.

Referring to FIGS. 1 and 2, alignment mark 4, which is formed in interlayer insulation film 5 which serves as an insulation layer, is rectangular in plan and is formed as a recess portion of about 1.0 $\mu$m in depth having two sets of opposing sidewalls 4a, 4b and 4c, 4d.

In the recess portion, a closed convex portion 4A is provided at the position opposite to and about 0.5 $\mu$m–1.0 $\mu$m away from sidewalls 4a, 4b, 4c and 4d as a film growth control region.

Next, with reference to FIGS. 4–6, the method for manufacturing alignment mark 4 having the above described structure will be described. Here, FIGS. 4–6 are sections taken along the line X–X' of FIG. 1.

Figure 4:
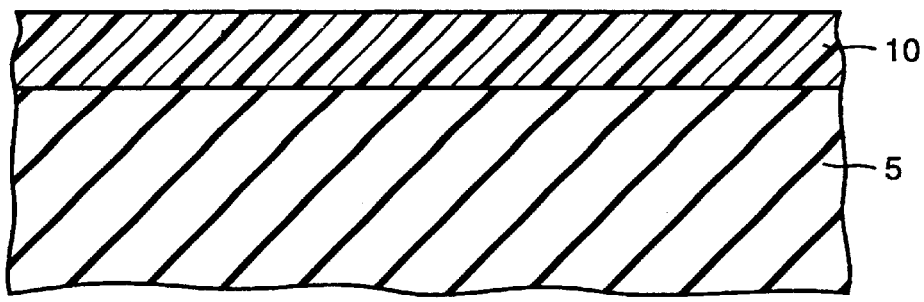
FIGS. 4–6 are sections showing a first to a third steps of the method of manufacturing alignment mark 4 in accordance with the first embodiment.
Figure 5:
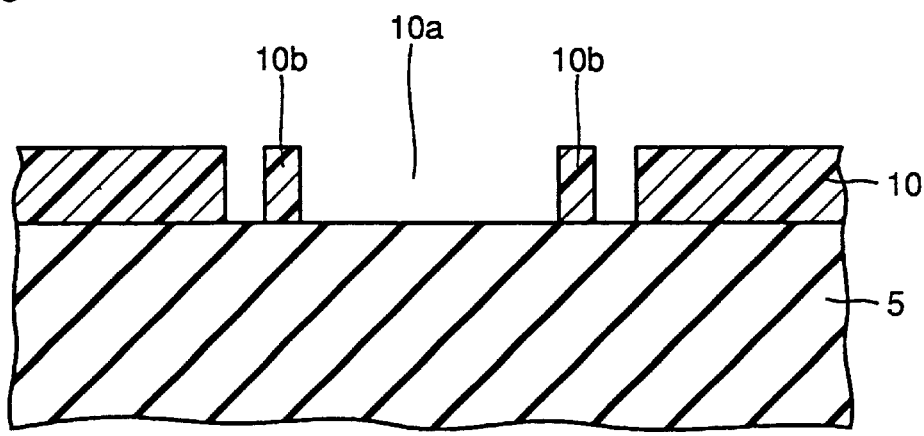

As can be seen from FIG. 4, a resist film 10 is formed on interlayer insulation film 5. Then as shown in FIG. 5, the patterning of resist film 10 is performed using a photolithography technique, whereby an opening pattern 1a and a residual pattern 10b are formed respectively at the position corresponding to the recess portion of alignment mark 4 and the position corresponding to convex portion 4A.

Figure 6:
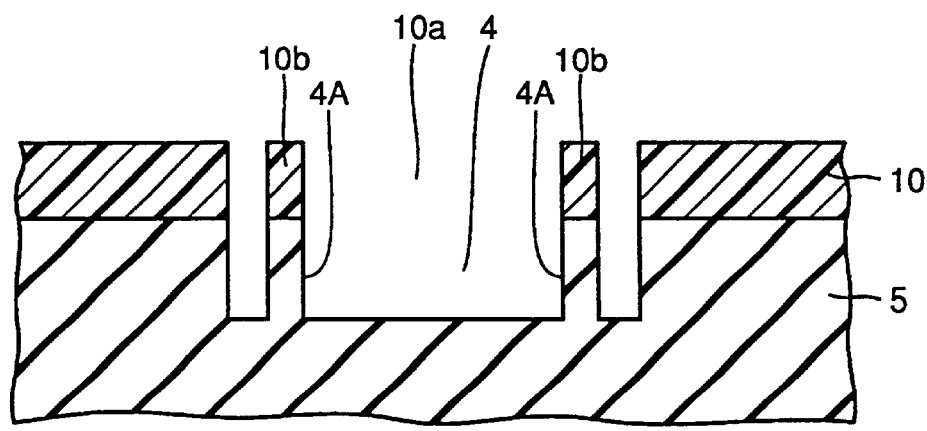

Next with reference to FIG. 6, the etching of interlayer insulation film 5 is performed using resist film 10 having opening pattern 10a and residual pattern 10b as a mask.

The etching here is an anisotropic dry etching. The condition for dry etching is as follows: an etchant is $C_4F_8$, $CF_4$, $CHF_3$, $O_2$, Ar or the like; a gas pressure is in the range of $1\times10^{-5}$ to several tens Torr; a voltage is tens to thousands W of a.c. bias, d.c. bias or microwave. Then with a removal of resist film 10, alignment mark 4 in accordance with the first embodiment is finished.

When first metal interconnection layer 6 of aluminum or the like is deposited as an interconnection layer on alignment mark 4 in accordance with the first embodiment having the above described structure, by the interconnection process using the high temperature sputtering technique, as again can be seen from FIG. 2, the surfaces of sidewalls 4a and 4b opposite to convex portion 4A, and, the surfaces of convex portion 4A opposite to sidewalls 4a and 4b each serve as a block with respect to an angle of incidence (arrow R of FIG. 2) of grains sputtered for forming first metal interconnection layer 6.

Therefore a few grains sputtered for forming first metal interconnection layer 6 enter and are deposited on the surface of sidewalls 4a and 4b opposite to convex portion 4A and on the surfaces of convex portion 4A opposite to sidewalls 4a and 4b, whereby the deposition of first metal interconnection layer 6 on these portions are small. As a result, the grain growth of first metal interconnection layer 6 and the flow of interconnection layer material for first metal interconnection layer 6 in this area are suppressed.

Hence, side surfaces 60a, 60b, 61a, and 61b (regions enclosed and designated by A in FIG. 2), which are approximately parallel with sidewalls 4a and 4b, of first metal interconnection layer 6 are formed on the surfaces of sidewalls 4a and 4b opposite to convex portion 4A and the surfaces of convex portion 4A opposite to sidewalls 4a and 4b.

Figure 3:
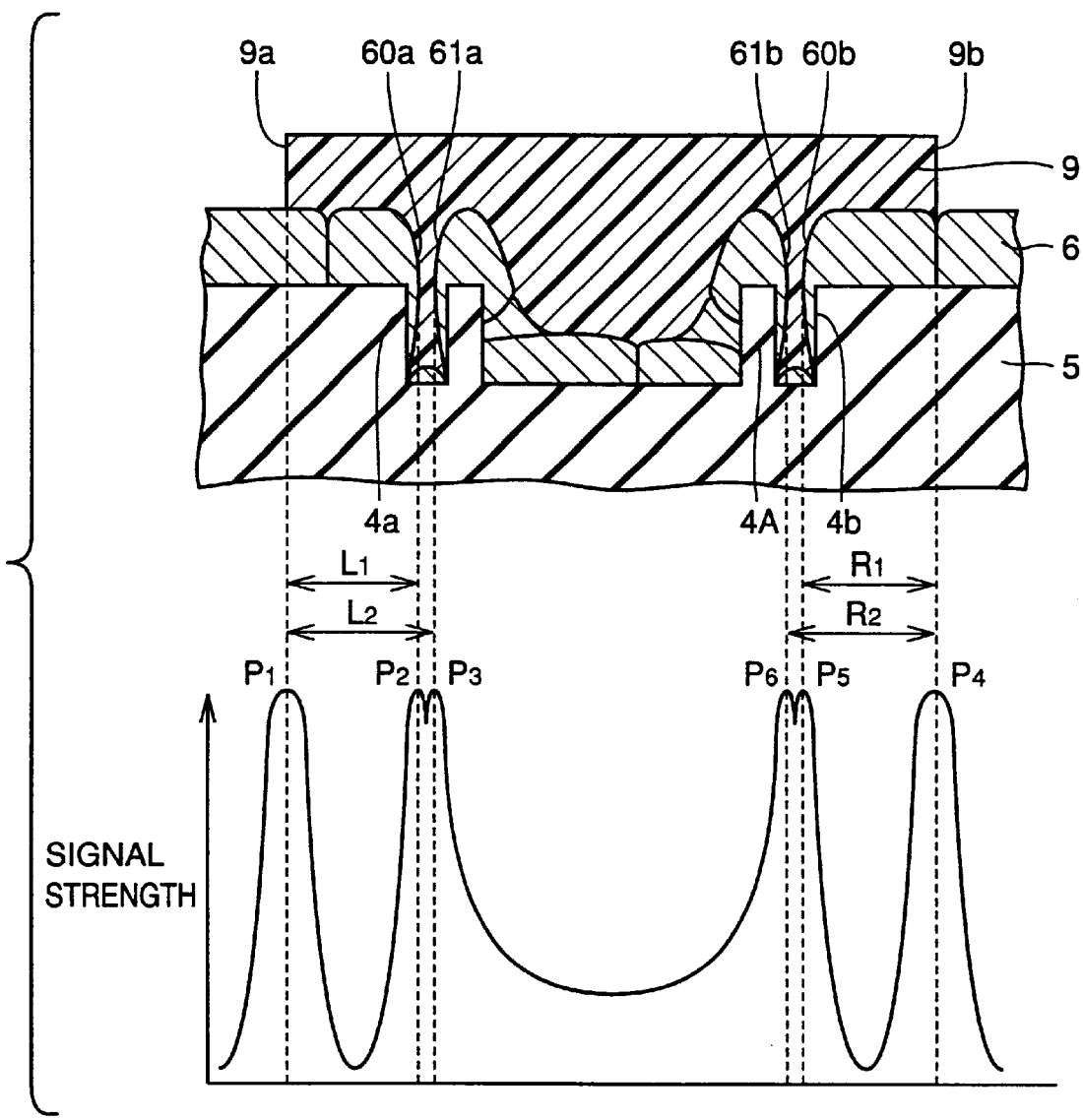
FIG. 3 is a graph showing detection signal strength measured at the section taken along the line X–X' of FIG. 1.

With the formation of side surfaces 60a, 60b, 61a and 61b of first metal interconnection layer 6, the distribution of detection signal strength measured at the section taken along the line X–X' of FIG. 1 is obtained as shown in FIG. 3. As signals P1 and P4 corresponding respectively to side surfaces 9a and 9b of resist film side alignment mark 9 and signals P2, P5, P3 and P6 corresponding to side surfaces 60a, 60b, 61a and 61b of first metal interconnection layer 6 have a high strength and a distinct peak, their location is readily detected.

As a result, a distance L1 between signal P1 and signal P2, a distance L2 between signal P1 and signal P3, a distance R1 between signal P4 and signal P5 and a distance R2 between signal P4 and signal P6 can be accurately measured.

Even if the signal strength at side surfaces 60a, 60b, 61a and 61b of first metal interconnection layer 6 are measured at the points different from the line X–X' of FIG. 1, a uniform measurement result can be obtained because the irregularities of vertical surfaces are decreased.

Though in the foregoing, signal strength measurement along the line X–X' with respect to sidewalls 4a and 4b has been described, the same advantage can be obtained with respect to sidewalls 4c and 4d.

Second Embodiment

Figure 7:
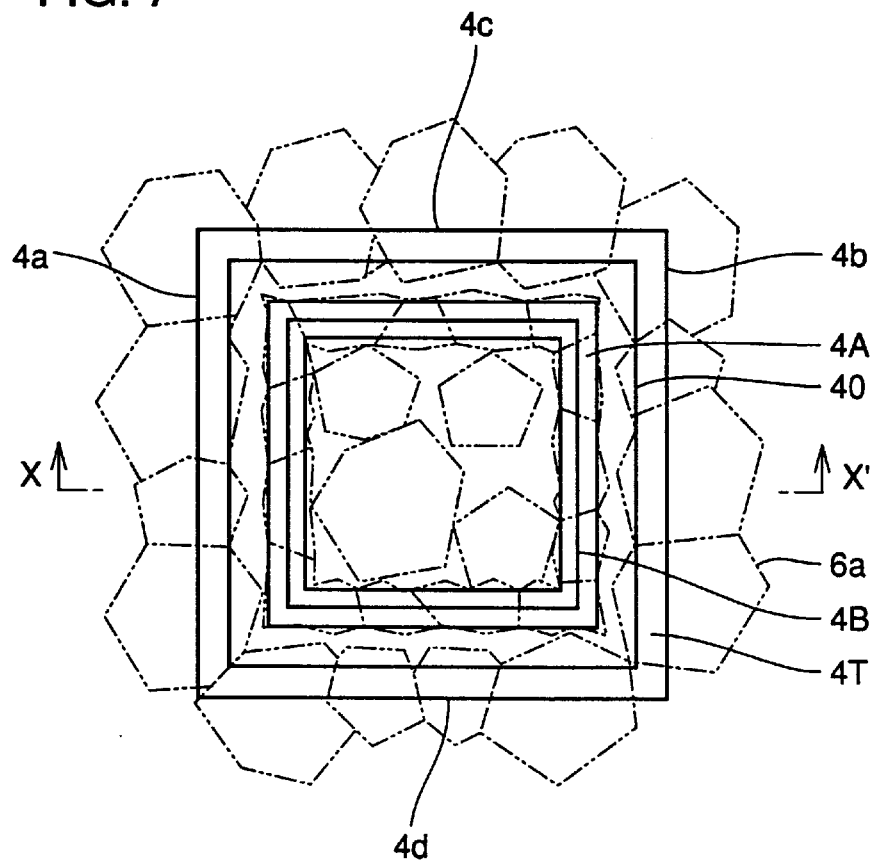
FIG. 7 is a plan view of an alignment mark 40 formed in interlayer insulation film 5 in accordance with a second embodiment.
Figure 8:
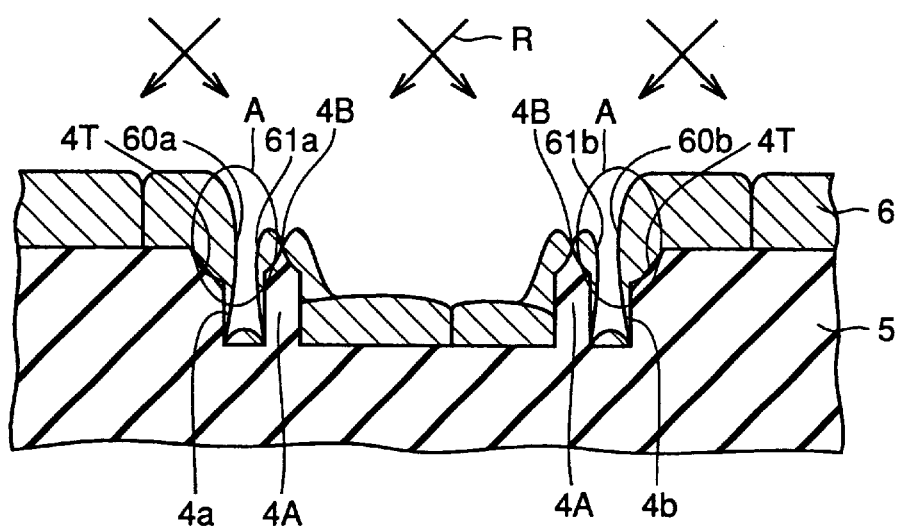
FIG. 8 is a section taken along a line X–X' of FIG. 7.

With reference to FIGS. 7 and 8, the structure of alignment mark 40 in accordance with the second embodiment will be described. As the location of the alignment mark is the same with that of the first embodiment, the same element is designated by the same character and the detailed description thereof will not be repeated. FIG. 7 is a plan view of alignment mark 40 formed in interlayer insulation film 5. First metal interconnection layer 6 is designated by a two-dot chain line for convenience of description.

Referring to FIGS. 7 and 8, the structure of alignment mark 4 in accordance with the first embodiment and that of alignment mark 40 in accordance with the second embodiment are different in that in the second embodiment a sharp ridge portion 4B is formed at the upper end of closed convex portion 4A and a taper 4T, which parts from the recess portion as it goes upward, is formed in the upper end region of sidewalls 4a, 4b, 4c and 4d of the recess portion, and otherwise those two embodiments are the same.

Hereinafter with reference to FIGS. 10–13, the method for manufacturing alignment mark 40 having the above mentioned structure will be described. Here, FIGS. 10–13 are sections taken along the line X–X' of FIG. 7.

Figure 10:
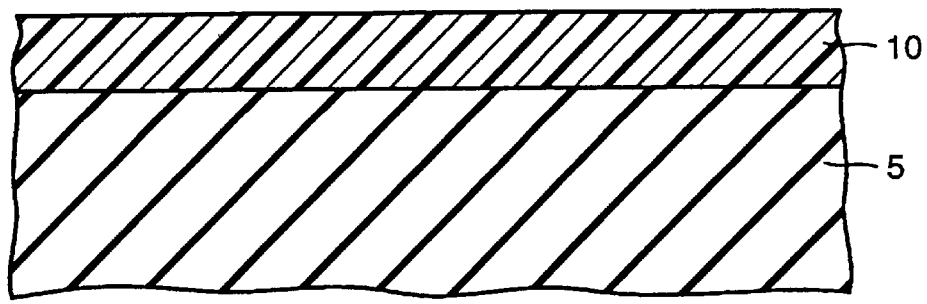
FIGS. 10–13 are sections showing first to fourth steps of the method of manufacturing alignment mark 40 in accordance with the second embodiment.
Figure 11:
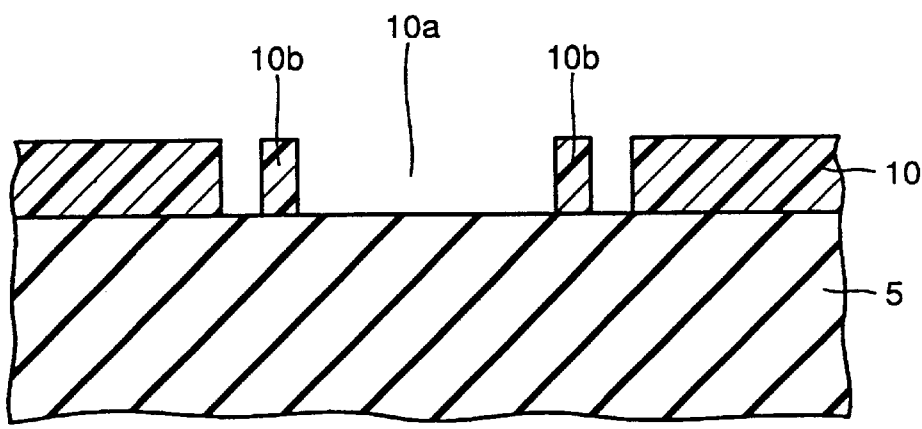
Figure 12:
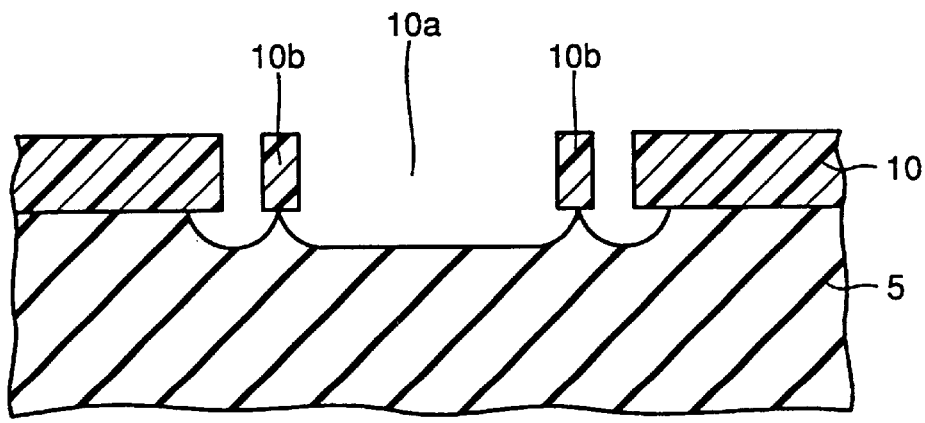

Referring to FIG. 10, resist film 10 is formed on interlayer insulation film 5. Then as can be seen from FIG. 11, resist film 10 is patterned by photolithography, whereby opening pattern 10a and residual pattern 10b are formed respectively at the position corresponding to the recess portion of alignment mark 40 and the position corresponding to convex portion 4A Then as shown in FIG. 12, interlayer insulation film 5 is etched using resist film 10 having opening pattern 10a and residual pattern 10b as a mask.

The etching is an isotropic wet etching. The condition for the wet etching is as follows: an etchant is BHF (Buffered Hydrofluoric Acid) diluted with water to the concentration of BHF:water=1:few—tens; and an etching period is a few minutes.

Figure 13:
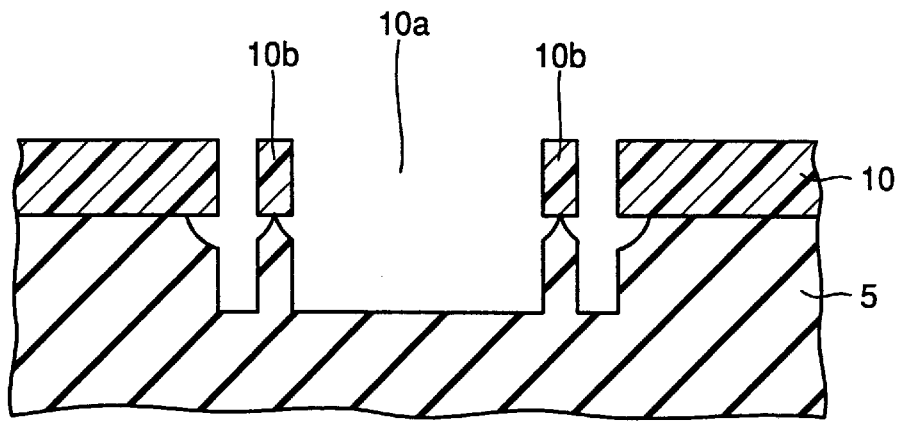

Next with reference to FIG. 13, interlayer insulation film 5 is etched using resist film 10 again as a mask. This etching is an anisotropic dry etching. The condition for the dry etching is as follows; an etchant is $C_4F_8$, $CF_4$, $CHF_3$, $O_2$, Ar or the like; a gas pressure is in the range from $1 \times 10^{-5}$ to several tens Torr; and a voltage is in the range from tens–thousands W of a.c. bias, d.c. bias, a microwave or the like. With the subsequent removal of resist film 10, alignment mark 40 in accordance with the second embodiment is finished.

When first metal interconnection layer 6 of aluminum or the like is deposited by the interconnection process using the high temperature sputtering technique as an interconnection layer on alignment mark 40 in accordance with the second embodiment having the above described structure, in addition to the same effect obtained by alignment mark 4 in accordance with the first embodiment, following advantages can be obtained.

In alignment mark 40 in accordance with the second embodiment, sharp ridge portion 4B is formed at the upper end of closed convex portion 4A, and taper 4T, which parts away from the recess portion as it goes upwards, is formed in the upper end region of sidewalls 4a, 4b, 4c and 4d of the recess portion. Therefore as can be seen from FIG. 8, the angle of incidence (arrow R in FIG. 2) of sputtered grains for first metal interconnection layer 6 at ridge portion 4B is limited compared with that at the planar top portion of the convex portion in the first embodiment, whereby the deposition of sputtered grains for forming first metal interconnection layer 6 is small.

As a result, the grain growth of first metal interconnection layer 6 and the flow of interconnection layer material for the first metal interconnection layer 6 at ridge portion 4B are suppressed.

Hence, side surfaces 60a, 60b, 61a and 61b (regions enclosed and designated by A in FIG. 8) of first metal interconnection layer 6 approximately parallel with sidewalls 4a and 4b, are formed on the surfaces of sidewalls 4a and 4b opposite to convex portion 4A and the surfaces of convex portion 4A opposite to sidewalls 4a and 4b in the second embodiment as well as in the first embodiment, whereby ridge portion 4B with little deposition of first metal interconnection layer 6 is formed.

Figure 9:
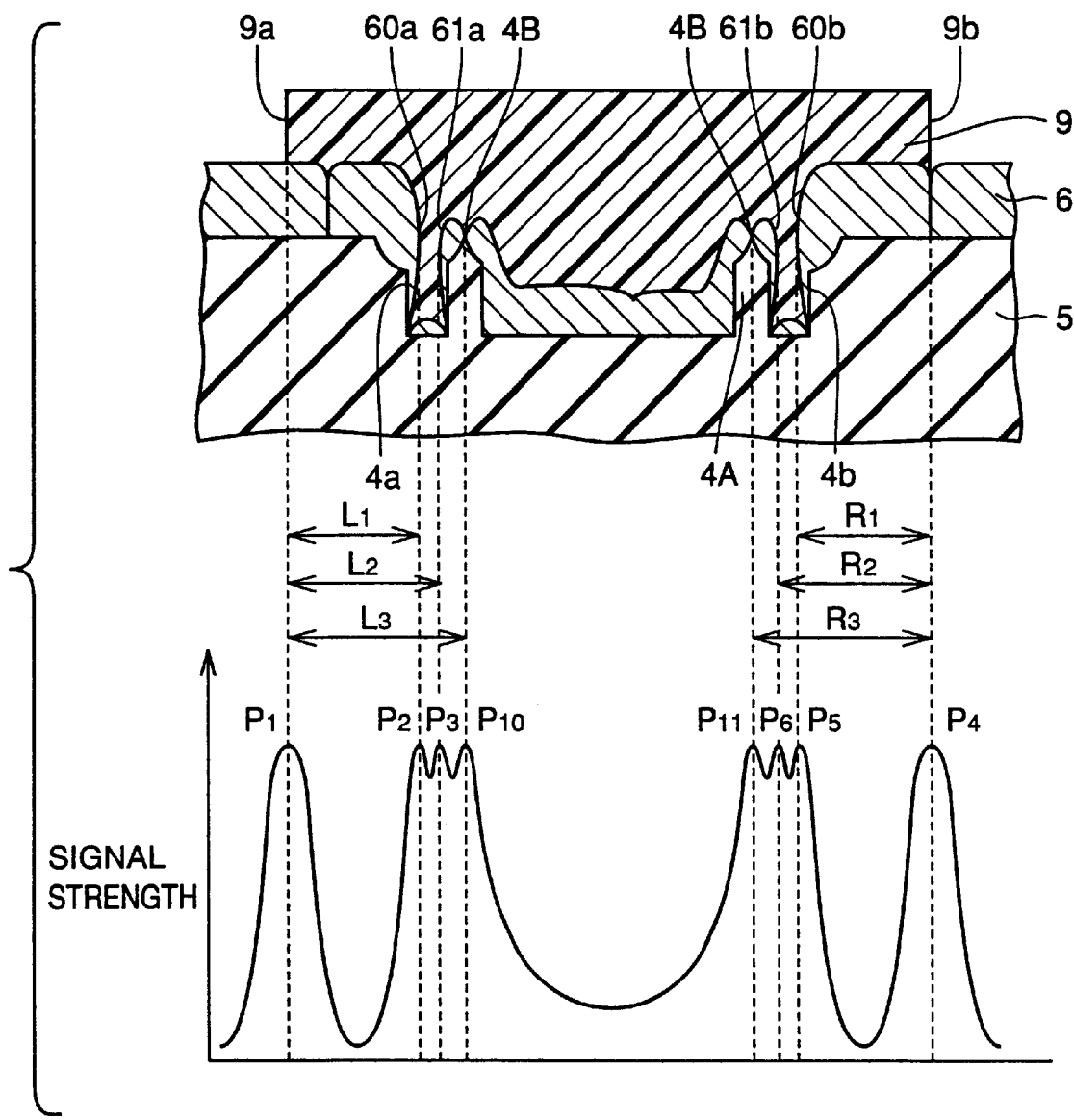
FIG. 9 is a graph showing, detection signal strength measured at the section taken along the line X–X' of FIG. 7.

As can be seen from FIG. 9 showing the detection signal strength measured at the section taken along the line X–X' of FIG. 7 with respect to side surfaces 60a, 60b, 61a and 61b of first metal interconnection layer 6 and ridge portion 4B, aside from signals P1 and P4 corresponding to side surfaces 9a and 9b of resist film side alignment mark 9 and signals P2, P5, P3 and P6 corresponding to side surfaces 60a, 60b, 61a and 61b of first metal interconnection layer 6, signals P10 and P11 corresponding to ridge portion 4B can be detected as having high strength distinct peak.

As a result, in addition to a distance L1 between signal P1 and signal P2, a distance L2 between signal P1 and signal P3, a distance R1 between signal P4 and signal P5 and a distance R2 between signal P4 and signal P6, a distance L3 between signal P1 and signal P10 and a distance R3 between signal P4 and signal P11 can be accurately measured.

In addition, even if the signal strength at side surfaces 60a, 60b, 61a and 61b of first metal interconnection layer 6 are measured at the points different from the line X–X' of FIG. 7, a uniform measurement result can be obtained because of the decrease in irregularities of vertical surfaces.

Though in the foregoing, the signal strength measurement along the line X–X' with respect to sidewalls 4a and 4b has been described, the same advantage can be obtained with respect to sidewalls 4c and 4d.

Third Embodiment

Figure 14:
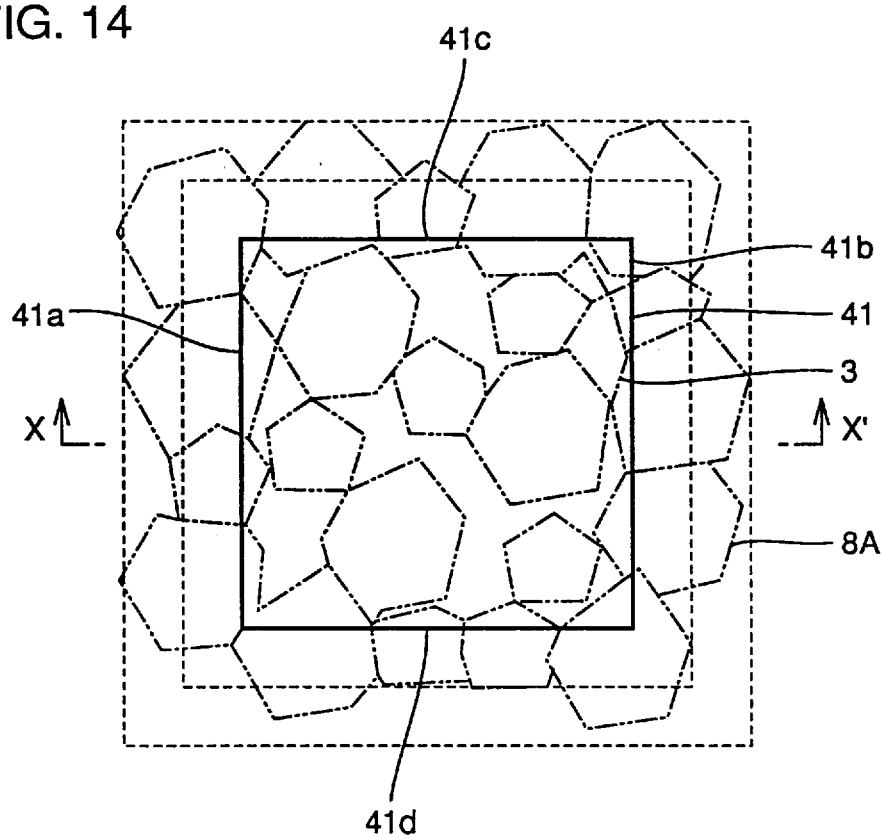
FIG. 14 is a plan view of an alignment mark 41 formed in interlayer insulation film 7 in accordance with a third embodiment.
Figure 15:
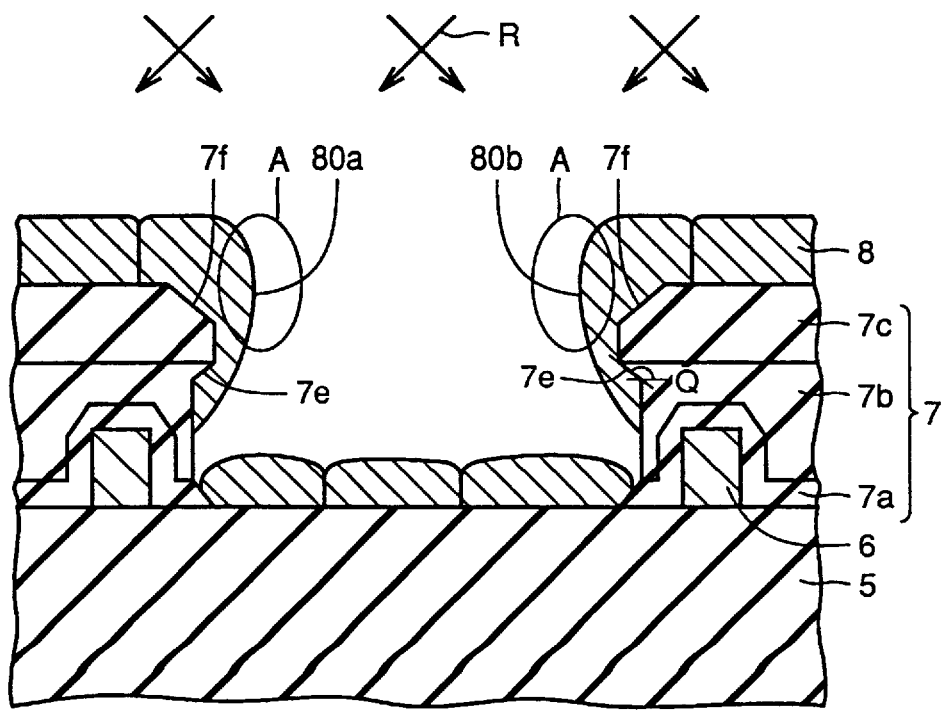
FIG. 15 is a section taken along a line X–X' of FIG. 14.

Referring to FIGS. 14 and 15, the structure of alignment mark 41 in accordance with the third embodiment will be described. Unlike the first and the second embodiments, alignment mark 41 is formed in interlayer insulation film 7 shown by section in FIG. 21.

The same element with the first and the second embodiments is designated by the same character and the detailed description thereof will not be repeated FIG. 14 is a plan view of alignment mark 41 formed in interlayer insulation film 7. Second metal interconnection layer 8 is shown by a two-dot chain line for convenience of description.

As shown in FIGS. 14 and 15, interlayer insulation film 7, which serves as an insulation layer, is formed on first metal interconnection layer 6 which actually is two lower interconnection layers arranged parallel to each other. Alignment mark 41, which is formed in interlayer insulation film 7 and between two lower interconnection layers 6 arranged parallel to each other, is rectangular in plan and formed as a recess portion having two sets of opposing sidewalls 41a, 41b and 41c, 41d.

Interlayer insulation film 7 is of a three layered structure including a lower layer 7a of plasma oxide film, a middle layer 7b of SOG and an upper layer 7c of plasma oxide film. In the recess portion, an exposed surface is formed protruding inside the recess portion further at lower layer 7a and upper layer 7c than at middle layer 7b. A side surface 7e, having an exposed surface forming a slope of 90° or more (angle designated by Q in FIG. 15), is provided at the upper portion of middle layer 7b.

In addition, in the upper end region of the exposed surface of upper layer 7c, a taper 7f is formed which parts away from the recess portion as it goes upwards. A film growth control region includes taper 7f formed in upper layer 7c and side surface 7e formed in middle layer 7b.

Figure 17:
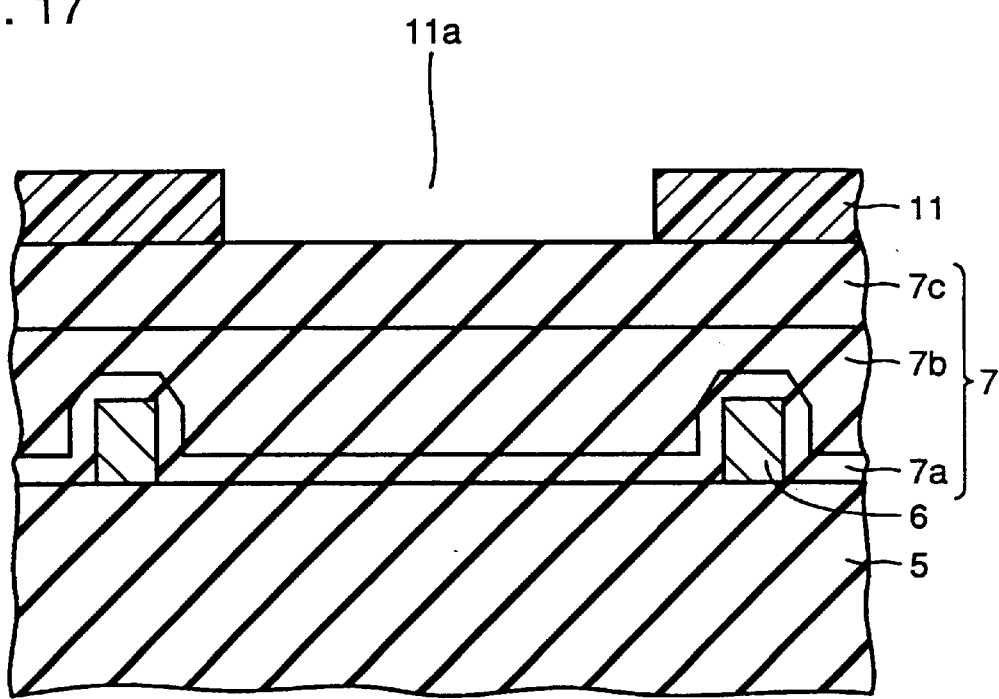
FIGS. 17 and 18 are sections showing first and second steps of the method of manufacturing alignment mark 41 in accordance with the third embodiment.
Figure 18:
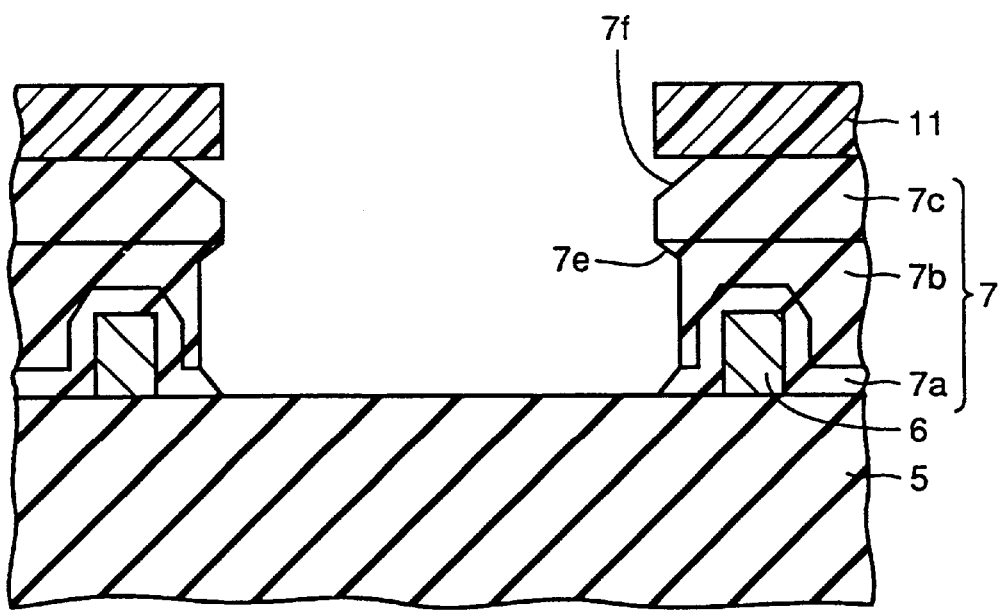

With reference to FIGS. 17 and 18, the method for manufacturing alignment mark 41 having above mentioned structure will be described.

With reference to FIG. 17, two lower interconnection layers 6 arranged parallel to each other are formed on interlayer insulation film 5.

Thereafter, lower layer 7a of plasma oxide film with a thickness of 0.1 $\mu$m–0.5 $\mu$m, middle layer 7b of SOG with a thickness of 0.2 $\mu$m–0.4 $\mu$m and upper layer 7c of plasma oxide film with a thickness of 0.31 $\mu$m–1.0 $\mu$m are sequentially formed so as to cover two lower interconnection layers 6.

Interlayer insulation film 7 is formed as a three layered structure in order to maintain a film characteristics required for interlayer insulation film 7 and to planarize the surface of interlayer insulation film 7 at the same time. Though SOG has a favorable film characteristic, a step coverage is the problem because it easily produces a step in conformity with a shape of underlying lower layer. On the other hand, though a plasma oxide film is not favorable in its film characteristic, with respect to the coverage it is not prone to the effect of the shape of underlying lower layer and seldom produces a step. Hence, these two different films are combined as described above.

Then, a resist film 11 having an opening pattern 11a at the position corresponding to the section between two lower interconnection layers 6 arranged parallel to each other is formed on upper layer 7c.

As shown in FIG. 18, interlayer insulation film 7 is then etched using resist film 11 having opening pattern 11a as a mask.

The etching performed here is a combination of an isotropic wet etching and an anisotropic dry etching. The condition for the wet etching is as follows: an etchant is BHF (Buffered Hydrofluoric Acid) diluted with water to the concentration of BHF:water=1:few to tens; and an etching period is a few minutes.

The condition for the dry etching is as follows: an etchant is $C_4F_8$, $CF_4$, $CHF_3$, $O_2$, Ar or the like; a gas pressure is in the range from $1 \times 10^{-5}$ to several tens Torr; and a voltage is tens to thousands W of a.c. bias, d.c. bias, a microwave or the like.

A surface exposed by the etching treatment is largest in middle layer 7b and protrudes inside the recess portion further at lower and upper layers 7a and 7c than at middle layer 7b, because of the difference in step coverage of middle layer 7b and lower layer 7a formed in the neighborhood of two lower interconnection layers 6. Thus, side surface 7e with an exposed surface having a slope of 90° or more is formed in the upper portion of middle layer 7b and taper 7b, which parts away from the recess portion as it goes upwards, is formed in the upper end region of the exposed surface of upper layer 7c.

By the subsequent removal of resist film 11, alignment mark 41 in accordance with the third embodiment is finished.

With reference to FIG. 15, with alignment mark 41 in accordance with the third embodiment, when second metal interconnection layer 8 of aluminum and so on is deposited on alignment mark 41 by the high temperature sputtering technique, the film growth control region, including taper 7f formed in upper layer 7c and side surface 7e formed in middle layer 7b, serves as a block with respect to an angle of incidence (arrow R of FIG. 15) of grains sputtered for forming second metal interconnection layer 8. As a few grains sputtered for forming second metal interconnection layer 8 enter and are deposited on middle layer 7b exposed inside the recess portion, the deposition of second metal interconnection layer 8 in this area is small.

SOG used for middle layer 7b releases more gas such as $H_2O$ than plasma oxide film of upper and lower layers 7c and 7a at the heating. The generation of gas has an effect of suppressing the flow of material for second metal interconnection layer 8. Therefore by making an exposed area of middle layer 7b larger than that of lower and upper layers 7a and 7c, the advantages described above can effectively be achieved.

Thus, the grain growth of second metal interconnection layer 8 and the flow of interconnection material at middle layer 7b exposed inside the recess portion are suppressed. Hence, side surfaces 80a and 80b (regions enclosed and designated by A in FIG. 15) of second metal interconnection layer 8 are formed approximately perpendicular to the exposed portion of upper layer 7c exposed inside the recess portion.

Figure 16:
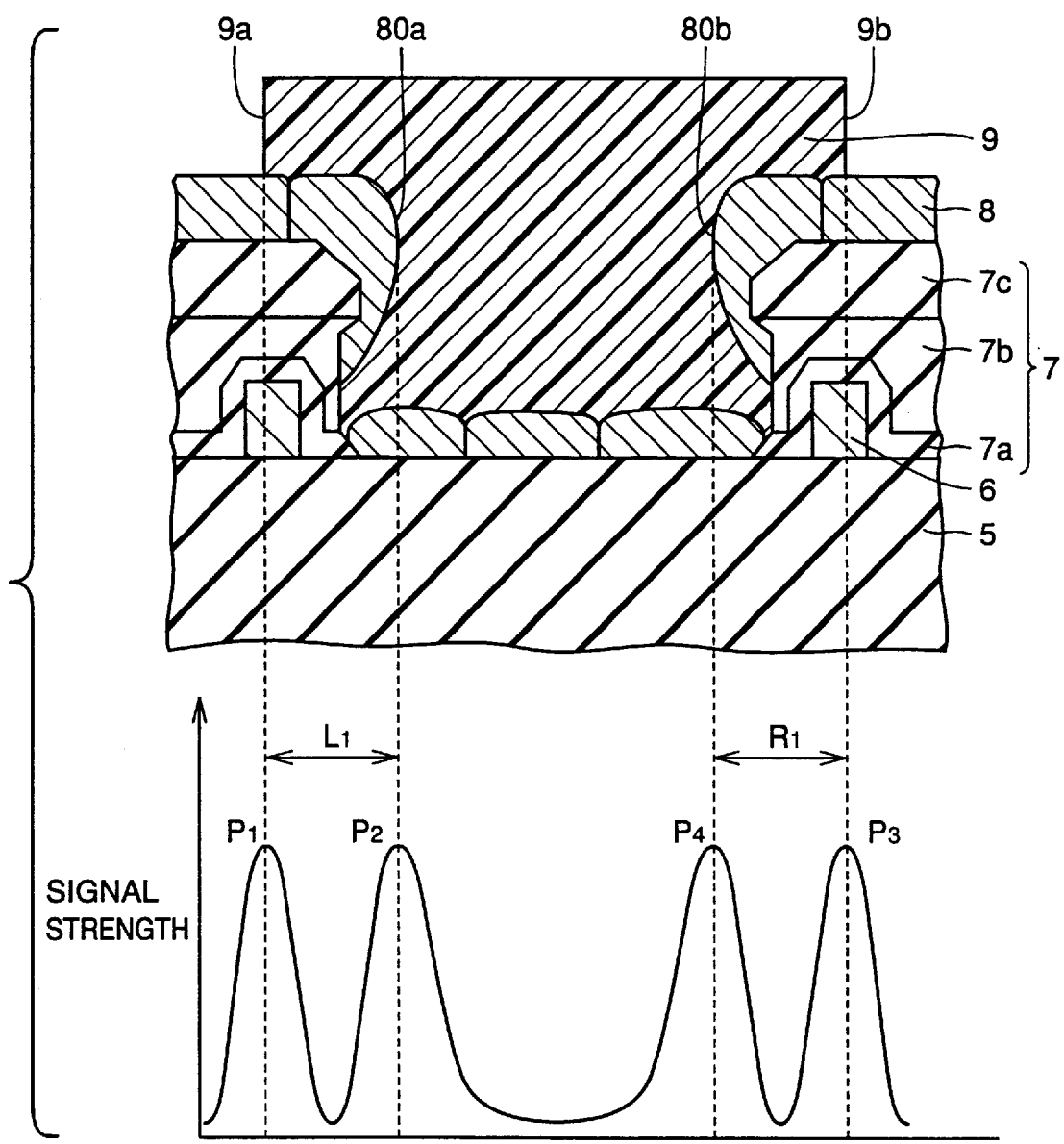
FIG. 16 is an illustration showing detection signal strength measured at the section taken along the line X–X' of FIG. 14.

The detection signal strength measured at the section taken along the line X–X' of FIG. 14 with respect to side surfaces 80a and 80b of second metal interconnection layer 8 is shown in FIG. 16. Signals P1 and P3 corresponding to side surfaces 9a and 9b of resist film side alignment mark 9 and signals P2 and P4 corresponding to side surfaces 80a and 80b of second metal interconnection layer 8, which have a high strength and a distinct peak, can be detected.

As a result, the accurate measurements of a distance L1 between signal P1 and signal P2 and a distance R1 between signal P3 and signal P4 are allowed.

In addition, even if the signal strength at side surfaces 80a and 80b of second metal interconnection layer 8 are measured at the points different from the line X–X' of FIG. 14, a uniform measurement result can be obtained because irregularities of vertical surfaces is decreased.

Though in the foregoing, signal strength measurement along the line X–X' with respect to sidewalls 41a and 41b has been described, the same advantage can be obtained with respect to sidewalls 41c and 41d.

Though in this embodiment, the difference of etching rate between lower layer 7a and middle and upper layers 7b and 7c constituting interlayer insulation film 7 is utilized as described above, in order to form a film growth control region including taper 7f and side surface 7e, the difference of contraction at the heat treatment can also be utilized. In addition, as far as it has a required film characteristic and step coverage for interlayer insulation film 7, the material is not limited to SOG and plasma oxide film.

Figure 19:
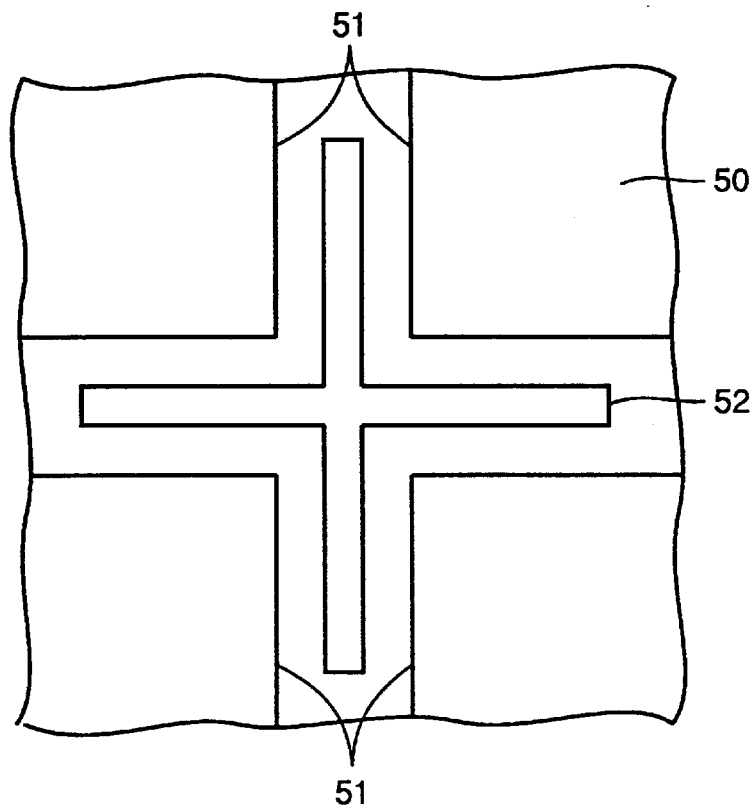
FIG. 19 is a plan view of an alignment mark 52 which is a common variation of all embodiments.

The same advantage as obtained by each embodiment can be achieved by applying alignment marks 4, 40 and 41 described above in the first to the third embodiments to a cross shaped alignment mark 52 formed between dicing lines 51 of four neighboring chips 50 shown in FIG. 19.

Figure 20:
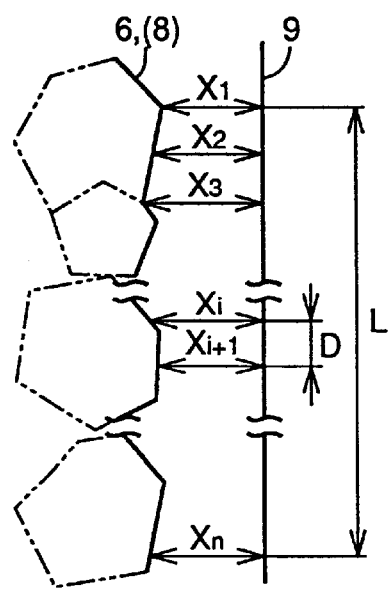
FIG. 20 is a schematic diagram related to calculation of a standard deviation σ, which is an index for signal strength measurement accuracy.

Here, in order to enhance the measurement accuracy of signal strength, the distance between first metal interconnection layer 6 (or second metal interconnection layer 8) and resist film 9 is measured at n points $(X_1-X_n)$ at an interval of D over a length L as shown in FIG. 20. When an average of the measurement value Xi $(X_1-X_n)$ is $X_A$, the standard deviation σ, which is an index for the measurement accuracy of signal strength, can be expressed by the following equation.

$$\sigma=((\Sigma(Xi-X_A)^2)\times D)^{1/2}$$

Therefore, the measurement accuracy of signal strength can be improved by providing alignment mark 52 so that the length L can be maximized.

With the semiconductor device with the alignment mark and manufacturing method thereof in accordance with the present invention, the easy and accurate detection of the location of interconnection layer deposited on the alignment mark is allowed with the film growth control region in the alignment mark. Although the alignment marks in accordance with the preferred embodiments have been described hereinabove as being applied to semiconductor devices having the structure shown in FIG. 21, the same can be applied to other semiconductor devices with similar structures.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device with an alignment mark for detecting location of an interconnection layer formed on an insulation later, the alignment mark including a recess portion being approximately rectangular in plan and having two sets of opposing sidewalls, wherein said recess portion includes a film growth control region for forming side surfaces approximately parallel to said sidewalls, on a surface of said interconnection layer which is formed in said recess portion opposite to said sidewalls when said interconnection layer is deposited.

2. The semiconductor device with the alignment mark according to claim 1, wherein said film growth control region includes a convex portion arranged in said recess portion such that it opposes to said sidewalls.

3. The semiconductor device with the alignment mark according to claim 2, wherein said convex portion has a sharp ridge portion at its upper end and said sidewall has at its upper end region facing said convex portion a taper parting from said convex portion as it goes upward.

4. The semiconductor device with the alignment mark according to claim 1, wherein said insulation layer is formed on two lower interconnection layers arranged parallel to each other, said recess portion is formed in said insulation layer placed between said two lower interconnection layers, said insulation layer including three layers, that is, a lower layer, a middle layer and an upper layer, and said film growth control region is formed in said recess portion, with an exposed surface protruding in said recess portion further at said upper layer than at said middle layer and a taper which parts away from said recess portion as it goes upward in the upper end region of said upper layer of said exposed surface.

5. A method of manufacturing a semiconductor device with an alignment mark, for detecting location of an interconnection layer formed on an insulation layer, the alignment mark being formed in said insulation layer as a recess portion approximately rectangular in plan and having two sets of opposing sidewalls, the alignment mark including convex portion arranged in said recess portion such that it opposes to said sidewall, the method comprising the steps of:

forming said insulation layer;

forming a resist film having an opening pattern which is rectangular in plan and a convex pattern formed a prescribed distance away from and opposite to an inner peripheral wall of said opening pattern; and forming said recess portion having two sets of opposing sidewalls and said convex portion arranged in said recess portion such that it opposes to said sidewalls, by patterning said insulation layer by etching using said resist film as a mask.

6. The method of manufacturing the semiconductor device with the alignment mark according to claim 5, wherein the step of forming said recess portion and said convex portion includes steps of:

performing a first patterning of said insulation layer by said wet etching technique using said resist film as a mask; and performing a second patterning of said insulation layer by a dry etching technique using said resist film as a mask after the first patterning of said insulation layer.

7. A method of manufacturing a semiconductor device with an alignment mark formed as a recess portion approximately rectangular in plan in an insulation layer placed between two lower interconnection layers and an interconnection layer for detecting locations of said two lower interconnection layers arranged parallel to each other and said interconnection layer formed on said two lower interconnection layers in a direction not parallel to the lower interconnection layers, the method comprising the steps of:

forming said two lower interconnection layers arranged parallel to each other;

forming said insulation layer on said two lower interconnection layers, said step of forming said insulation layer including a step of forming a three layered structure having a lower layer, a middle layer and an upper layer;

forming a resist film having an opening portion on said insulation layer in a region corresponding to said recess portion in order to form said recess portion in said insulation layer placed between said two interconnection layers arranged parallel to each other; and patterning said insulation layer by etching using said resist film as a mask.

8. The method of manufacturing the semiconductor device with the alignment mark according to claim 7, wherein the step of patterning said insulation layer includes patterning said insulation layer by a combination of wet etching and dry etching using resist film as a mask.

9. The method of manufacturing the semiconductor device with the alignment mark according to claim 8, wherein said lower layer and upper layer include a material with relatively slower etching rate than said middle layer for same etchant.

10. The method of manufacturing the semiconductor device with the alignment mark according to claim 8, wherein said lower layer and upper layer include a material with relatively smaller contraction for heat treatment than said middle layer.

* * * * *